United States Patent [19]
Shone

[11] Patent Number: 5,822,243
[45] Date of Patent: Oct. 13, 1998

[54] DUAL MODE MEMORY WITH EMBEDDED ROM

[75] Inventor: Fuchia Shone, Hsinchu, Taiwan

[73] Assignee: Macronix International Co., Ltd., Hsinchu, Taiwan

[21] Appl. No.: 926,342

[22] Filed: Sep. 9, 1997

[51] Int. Cl.[6] .................................................. G11C 14/00
[52] U.S. Cl. ............................. 365/185.08; 365/185.11; 365/185.18; 365/185.24
[58] Field of Search .................. 365/185.08, 185.11, 365/185.18, 185.24, 185.27

[56] References Cited

U.S. PATENT DOCUMENTS

| | | | |
|---|---|---|---|
| 4,667,217 | 5/1987 | Janning | 357/54 |
| 4,864,374 | 9/1989 | Banerjee | 365/185.08 |
| 5,163,021 | 11/1992 | Mehrotra et al. | 365/185 |
| 5,257,224 | 10/1993 | Nojiri et al. | 365/175 |
| 5,311,463 | 5/1994 | Taji | 365/51 |
| 5,358,887 | 10/1994 | Hong | 437/48 |
| 5,403,764 | 4/1995 | Yamamoto et al. | 437/48 |
| 5,455,790 | 10/1995 | Hart et al. | 365/185.11 |
| 5,504,030 | 4/1996 | Chung et al. | 437/52 |
| 5,545,580 | 8/1996 | Sheng et al. | 437/48 |
| 5,556,800 | 9/1996 | Takizawa et al. | 437/45 |
| 5,574,685 | 11/1996 | Hsu | 365/185.11 |
| 5,576,573 | 11/1996 | Su et al. | 257/391 |
| 5,585,297 | 12/1996 | Sheng et al. | 437/52 |
| 5,677,556 | 10/1997 | Endoh | 365/185.11 |

OTHER PUBLICATIONS

Kenichi, K., Patent Abstracts of Japan, vol. 010, No. 074, Mar. 25, 1986, for JP60211699 published Oct. 24, 1985.
Yoshimitsu, Y., Patent Abstracts of Japan, vol. 014, No. 371, Aug. 10, 1990, for JP02133967 published May 23, 1990.

*Primary Examiner*—Son T. Dinh
*Attorney, Agent, or Firm*—Mark A. Haynes; Wilson, Sonsini, Goodrich & Rosati

[57] ABSTRACT

A dual mode memory cell and integrated circuit is provided with a native mode and a ROM mode. ROM code implants are incorporated into a standard memory array. The implants are deep implants which do not have a large effect on the threshold of the cell under normal substrate bias conditions. However, as the substrate bias is increased, they have an increasing effect on the cell threshold. Thus, the cells in one embodiment are floating gate cells that can be read in a flash mode, in which the threshold of the cell is determined predominately by charge stored in the floating gate of the cell, and a read only mode during which a substrate bias is applied, the charge stored in the floating gates in the sector to be read are equalized, and the threshold of the cell is determined predominately by the ROM code implants. Thus, more than one bit per cell is stored in the device, where one bit is stored in a read only mode and another bit is stored in a programmable and erasable mode in each cell in at least one sector of the memory device.

22 Claims, 6 Drawing Sheets

DUAL MODE MEMORY WITH EMBEDDED ROM

BACKGROUND OF THE INVENTION

1. Field of the Invention

The present invention relates to integrated circuit memories, and more particularly to a dual mode memory cell, having for example a read only mode and another mode, an erasable and programmable mode.

2. Description of Related Art

The cost of integrated circuit memory devices is closely related to the amount of area on an integrated circuit that is required to store a given amount of data, a parameter often referred to as the density of the device. By saving area on an integrated circuit, a manufacturer is able to make more chips with a given wafer in the fabrication factory. More chips per wafer translates directly to cost savings which can then be passed on to the consumers of the memory devices.

One avenue for increasing the density of memory devices involves storing more than one bit per memory cell. Thus for example, the ability to store two bits per cell allows twice the data density on an integrated circuit.

Multiple bit per cell technologies have been developed for floating gate memory devices. See U.S. Pat. No. 5,163,021 to Mehrotra, et al. However, the floating gate memory approach involves complex charging and discharging of the floating gates, and difficult sensing technology, which increases the complexity and reduces the reliability of the devices.

Another technique for increasing the density of memory devices involves multiple layers of memory cells in a given area on the device. This is typically implemented using thin film techniques in which transistors are stacked on top of one another, creating more than one memory cell per unit area. Typical prior art in this area includes U.S. Pat. No. 5,358,887 invented by Hong. The multi-layer approach requires special manufacturing steps, and special decoding circuitry which increase cost and reduce reliability.

Another characteristic of memory devices arises from the type of data to be stored in them. Some data, such as boot code and initialization parameters are read only rarely during operation of a circuit in which the data is stored. Other data is read often, but not changed. For other kinds of data, it is important to be able to dynamically change it, yet maintain it in a non-volatile form. These different kinds of data are often kept in different memory devices designed for the particular use pattern. Thus, for example, boot code which need not be changed in a system, is often stored in read only memory, because of the low cost. Other kinds of more fluid programs are often stored in flash memory. However, to accommodate the different kinds of storage, designers are required to include more that one memory chip on the system.

Accordingly, there is a need for a simpler, low cost technique for implementing multiple bits per cell in a memory device, and providing for read only and programmable modes in a single device.

SUMMARY OF THE INVENTION

The present invention provides a dual mode memory cell and integrated circuit including a ROM mode and a native mode. According to the present invention, ROM code implants are incorporated into a memory array designed for a native mode of operation. The implants are deep implants which do not have a large effect on the threshold of the cell under normal substrate bias conditions. However, as the substrate bias is increased, they have an increasing effect on the cell threshold. Thus, the cells in one aspect of the invention comprise floating gate memory cells that can be read in a flash mode, in which the threshold of the cell is determined predominately by charge stored in the floating gate of the cell, and in a read only mode during which a substrate bias is applied, the charge stored in the floating gates in the sector to be read are equalized or otherwise compensated for, and the threshold of the cell is determined predominately by the ROM code implants. Thus, more than one bit per cell is stored in the device, where one bit is stored in a read only mode and another bit is stored in a programmable and erasable mode in each cell in at least one sector of the memory device. Other memory device native modes to which the present invention is applied include static random access memory SRAM, dynamic random access memory DRAM, ferro-electric random access memory FRAM, EPROM, and others.

The present invention can be characterized as a integrated circuit memory that comprises an array of floating gate memory cells. The memory cells comprise floating gate transistors having channel regions in a semiconductor substrate and having threshold voltages dependent on a dope concentration in the channel regions and on charge in the floating gates. The array includes a first set of memory cells with a base dope concentration in the channel regions, and a second set of memory cells in the array with code implants which change the dope concentrations in the channel regions. A plurality of wordlines and bitlines are coupled respectively with rows and columns of memory cells in the array by which to read data stored in the array, and by which to charge and discharge the floating gates of memory cells in the array. Resources on the chip are provided to apply a first bias potential to the channel regions of memory cells in the array at which the memory cells have a particular threshold voltages, and to apply a second bias potential to channel regions of memory cells to induce a shift in the threshold voltages in the memory cells by the body effect. The shift due to the body effect is greater in the second set of memory cells than in the first set of memory cells due to the code implants.

The integrated circuit memory also includes resources to read memory cells in the array in a first mode during which the first bias potential is applied to the channel regions, and the threshold voltages of the memory cells are determined predominately by charge in the floating gates. Also, the resources include circuitry to read the cells in a second mode during which the second bias potential is applied to the channel regions and charge in the floating gates to be read in the array is equalized. In the second mode, the threshold voltages of the memory cells are determined predominately by the presence or absence of code implants.

The code implants in a preferred embodiment comprise boron and have a depth in the channel regions of the second set of memory cells according to an implantation with an ion implantation process at an energy which is high enough to create deep implants allowing for the threshold conditions outlined above. Thus for example the ion implantation process of boron in a silicon substrate has an energy in the range of 175 to 500 keV, and more preferably in the range of 200 to 250 keV.

According to another aspect of the invention, the array of floating gate memory cells includes a plurality of sectors. The resources are operable to read in the ROM mode on a sector by sector basis. According to another aspect, the ROM code implants are implanted in only one sector of the plurality of sectors in the device.

Accordingly, a flexible integrated circuit memory device is provided having a read only memory mode and a native mode, such as an erasable and programmable mode, for a single cell or a single array on the device. This enables storing persistent data in the ROM mode on the device, while providing the ability to use the same memory cells for erasable and programmable operation. This multiple bit per cell approach based on two read modes vastly saves in board space and increases memory density in a unique way.

Other aspects and advantages of the present invention can be seen upon review of the figures, the detailed description, and the claims which follow.

DETAILED DESCRIPTION

A detailed description of preferred embodiments of the present invention is provided with respect to FIGS. 1–8. A cell structure for implementing the dual mode cell is described with reference to FIGS. 1 and 2. A manufacturing process, architecture for integrated circuits, and a reading technique are described with respect to FIGS. 3–8.

Figure 1:
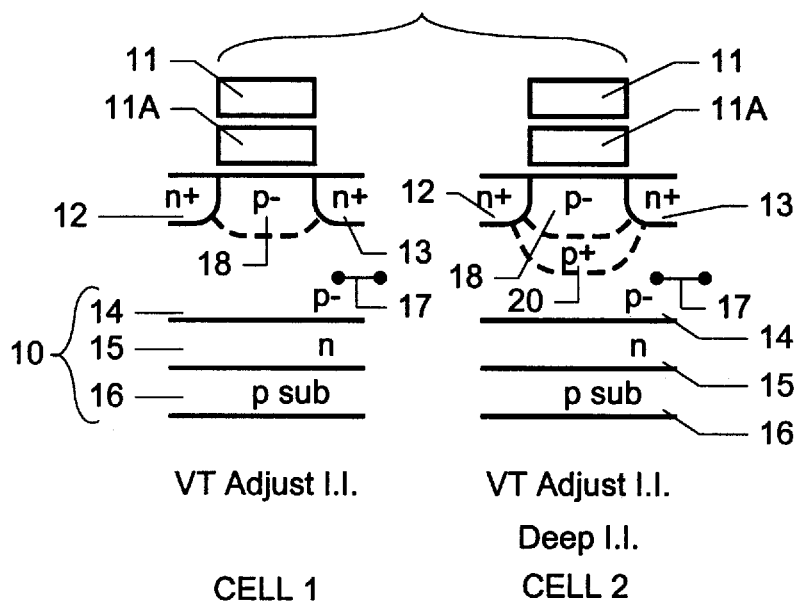
FIG. 1 illustrates the dual mode, floating gate memory, mask ROM cell according to the present invention in two coding states for the ROM mode, according to the present invention.

FIG. 1 shows two floating gate/ROM cells having the two ROM code implant states according to the present invention. Thus, cell 1 is a n-channel floating gate transistor formed in a semiconductor substrate 10. The n-channel transistor includes a control gate 11, such as formed by a wordline in a memory array, a floating gate 11A, a drain 12 formed by a n-type implant in the substrate 10, and a source 13 formed by a n-type implant in the substrate 10. The n-channel cell according to the present invention is formed in a channel well 14. The channel well 14 itself is implemented inside an isolation well 15. The isolation well 15 is formed in a p-type semiconductor substrate 16. The channel well 14 is coupled to a substrate bias terminal 17 by which a substrate bias potential is applied to the channel regions of the n-channel transistor. In a preferred embodiment, the channel region is formed with a p$^-$ implant referred to as a $V_T$ adjustment implant used to raise the threshold voltage of the n-channel transistor relative to that of a cell not having the implant. This base implant may or may not be necessary depending on the concentration of the channel well 14. Thus, cell 1 in FIG. 1 corresponds to a dual mode cell having only the $V_T$ adjust implant 18, and no code implant.

Cell 2 in FIG. 1 illustrates a deep code implant according to the present invention. The elements of cell 2 which correspond to the same elements in cell 1 have like reference numbers. Thus, cell 2 includes the $V_T$ adjust implant, represented by the region 18, and a deep implant represented by the region 20. The deep implant 20 will have a concentration of dopants greater than the $V_T$ adjust implant in region 18, and be implanted with a higher energy such that its depth is greater than the $V_T$ adjust implant.

In cells 1–2, the threshold voltage $V_T$, that is the voltage between the control gate 11 and the source 13 at which current is conducted in the transistor, is determined predominantly by a combination of the charge in the floating gate 11A, the dope concentrations in the channel of the cell, and by the substrate bias potential 17 applied to the channel well 14.

Figure 2:
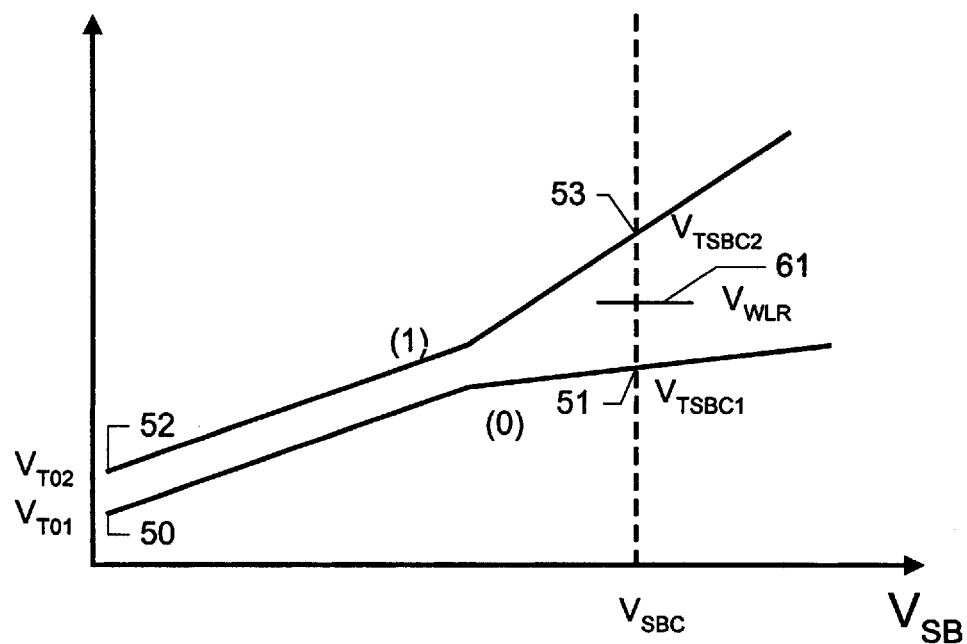
FIG. 2 is a graph illustrating the threshold voltage shift induced by increasing substrate bias.

FIG. 2 is a simplified graph showing the relationship of threshold voltage $V_T$ to substrate bias voltage $V_{SB}$, assuming equal charges on the floating gates. For cell 1, a threshold voltage $V_{T01}$ at point 50 is determined predominately by the $V_T$ adjust implant. As the substrate bias potential $V_{SB}$ increases, the threshold of cell 1 increases as well. At a critical substrate bias potential $V_{SBC}$, the threshold of cell 1 is seen at point 51.

For cell 2, the threshold voltage $V_{T02}$ is found at point 52, and at the substrate bias $V_{SBC}$, threshold voltage is found at point 53. As can be seen, the shift in threshold voltage induced by the increasing substrate bias potential is greater in cell 2 than it is in cell 1 due to the deep implant 20.

Accordingly, as can be seen in FIG. 2 a reading circuit in a ROM mode, can discriminate between cells 1 and 2, after applying the critical substrate bias potential $V_{SBC}$ by a wordline potential $V_{WLR}$ at point 61, so long as the floating gate charge is first equalized such as by an erase operation (or a program operation) on the cells to be read in the ROM mode.

The substrate potential $V_{SB}$ in FIG. 2 is negative for a n-channel device such as cells 1–2 in FIG. 1. For a p-channel device, the substrate potential is positive.

Figure 3A:
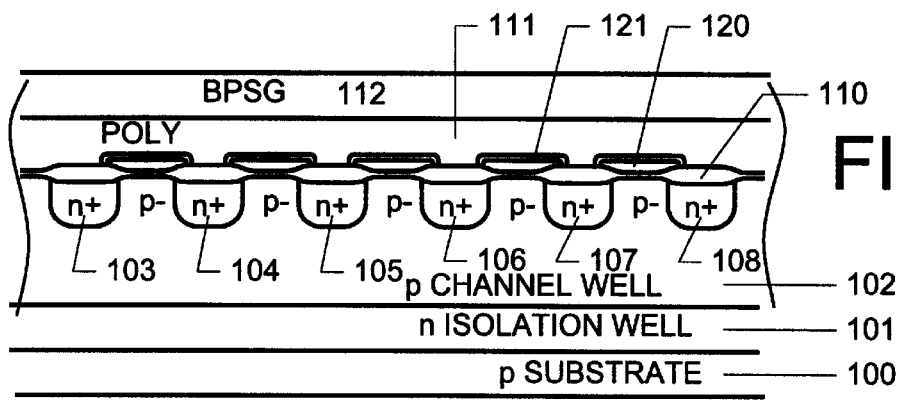
FIG. 3A–3B illustrate the code implant process according to the present invention for the dual mode device of the present invention.
Figure 3B:
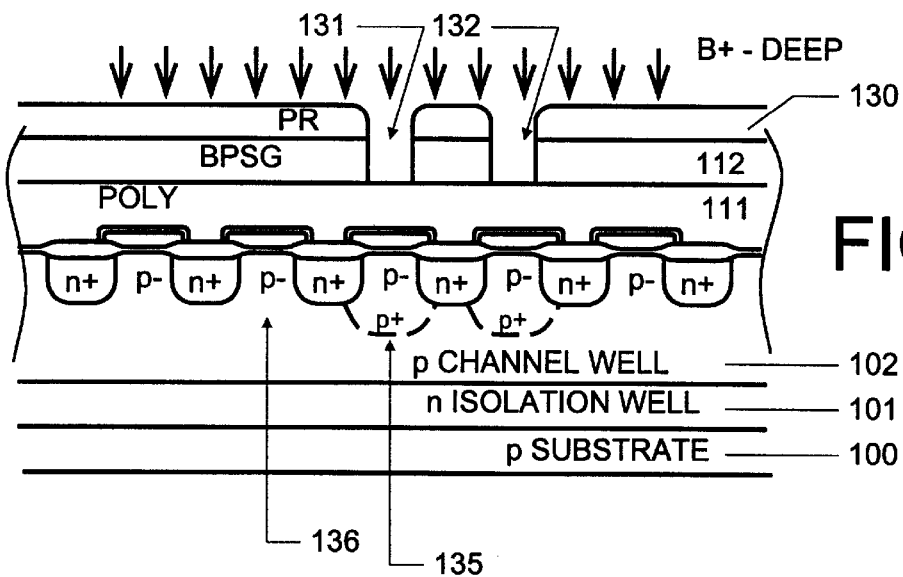

FIGS. 3A–3B illustrate a process for implanting the code implants according to the present invention. FIG. 3A illustrates a typical floating gate memory array in cross section prior to code implants. Thus the array is formed on a p-type substrate 100. A n-type isolation well 101 is formed in the substrate 100. A p-type channel well 102 is formed in the isolation well. Buried diffusion bit lines 103–108 are formed in the channel well. Dielectric layer 110 is formed over the semiconductor substrate. The dielectric layer 110 is thinner over the channel regions of the cells between the bit line diffusions than over the diffusions themselves, forming a tunnel dielectric for the cells. A floating gate 120, is formed over the tunnel dielectric in each cell, which is covered by an interpoly dielectric 121. A polysilicon wordline 111 is formed over the interpoly dielectric 121 to create a row of floating gate cells. A passivation layer 112 such as borophosphosilicate glass BPSG is formed over the wordline.

The deep n-type isolation well 110 is formed in one embodiment as an early step in the integrated circuit manufacturing process, during which the n-type isolation well is patterned, and a phosphorous implant for example 6×10$^{12}$/cm$^2$ is made at about 120 keV and yield at about 1050° C. for about 12 hours. The p-type channel well 102 is implemented in this embodiment by patterning the p-type well, and executing a 7×10$^{12}$/cm$^2$ boron implant at about 100 keV followed by an anneal at about 1050° C. for about 3 hours and 10 minutes. This processing results in a n-type well in selected areas with a depth of about 6 microns, and a p-type well within selected areas of the n-type well with a depth of about 3 microns. The parameters of the process for forming the n-type and p-type wells will vary from embodiment to embodiment, to suit particular design needs. The floating gate cell manufacturing steps in FIG. 3A can be done in a variety of technologies as well. See for example U.S. Pat. No. 5,526,707 entitled FLASH EPROM INTEGRATED CIRCUIT ARCHITECTURE invented by Tom D. H. Yiu, et al. which is incorporated by reference as if fully set forth herein.

To implement the code implants according to the present invention, a deep implant step as illustrated in FIG. 3B is executed.

FIG. 3B illustrates the implementation of a photo resist mask 130 over the passivation layer 112. The photo resist mask is used to expose channel regions 131, 132 of selected cells in the array. A deep boron implant in this embodiment is implanted with an ion implantation process with an energy in a range of 175–500 keV, more preferably in a range of 200–250 keV. As can be seen in FIG. 3B, the ROM code implant step results in cells storing ROM mode data. For example, cell 135 stores the bit (0). Cell 136 stores the bit (1).

Figure 4:
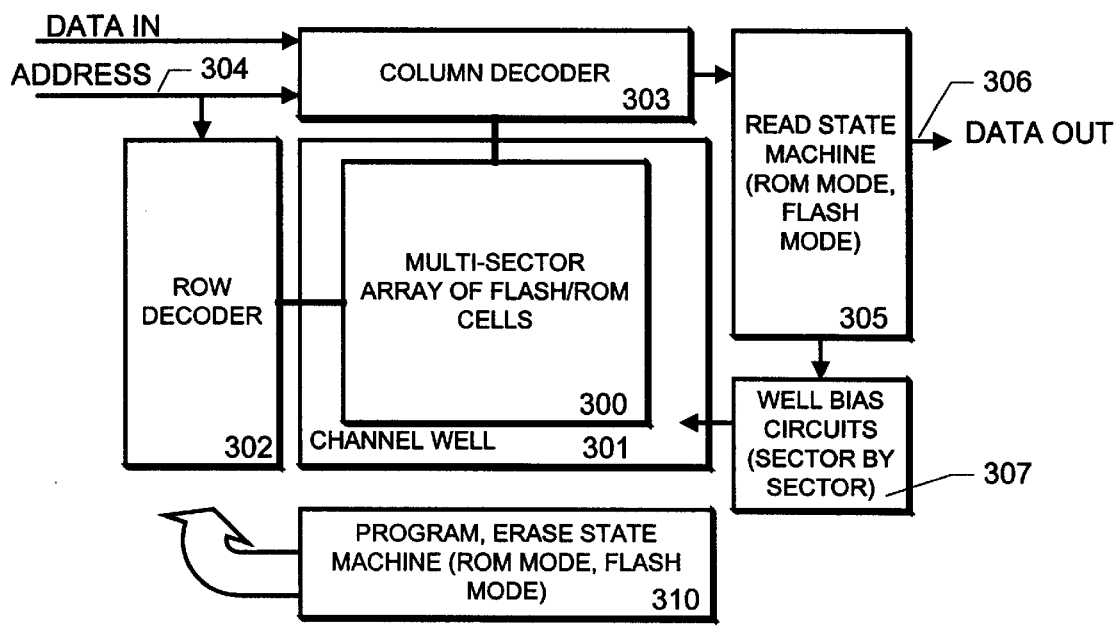
FIG. 4 is a simplified block diagram of an integrated circuit memory including an array of dual mode memory cells according to the present invention.

FIG. 4 is a simplified diagram of an integrated circuit memory device according to the present invention. The integrated circuit memory includes an array of flash memory/ROM cells 300 such as that illustrated with respect to FIGS. 1 and 3A–3B. The array of cells 300 is formed in a channel well 301. A row decoder 302 and a column decoder 303 are coupled with the array 300. An address is supplied on line 304 to the row decoder and column decoder to select a particular cell. The data of the accessed cell is supplied through the column decoder circuitry into a read state machine 305 through which the output data 306 is supplied. The read state machine 305 is coupled to well bias circuits 307 controlling the substrate bias in the channel well 301 as discussed above. The device also includes program, erase state machine 310, which is coupled to the array, the row decoder and the column decoder as known in the art. In a preferred embodiment, the floating gate memory array is implemented with a sector architecture allowing sector by sector erase operation, such as described in U.S. Pat. No. 5,414,664, entitled FLASH EPROM WITH BLOCK ERASE FLAGS FOR OVER-ERASE PROTECTION, which is incorporated by reference as if fully set forth herein.

Figure 5:
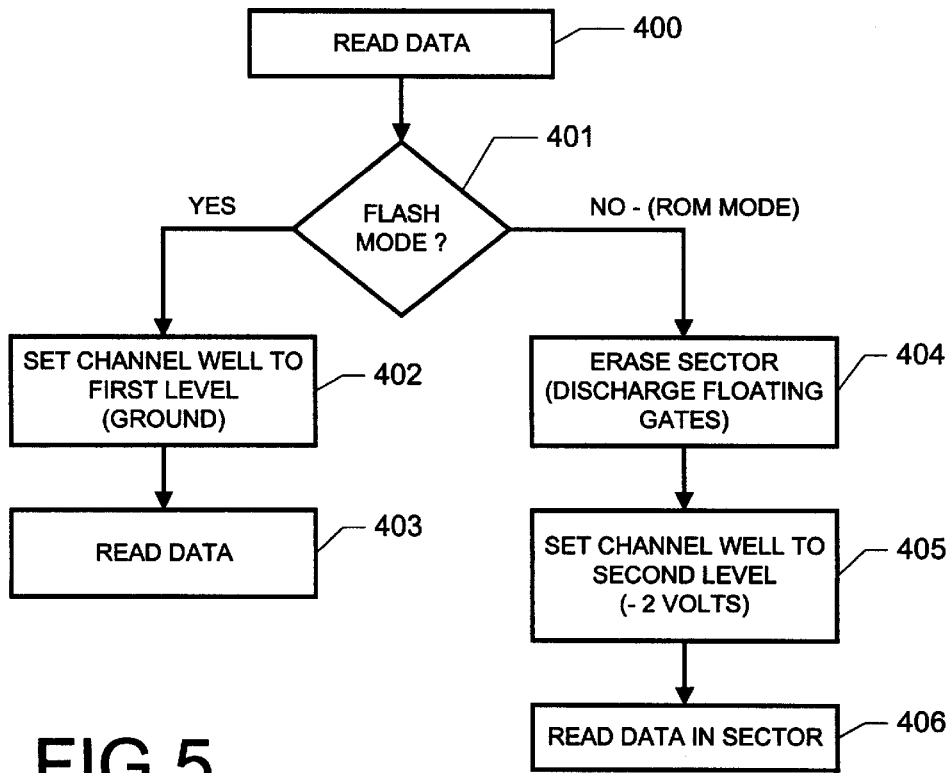
FIG. 5 is a flow chart illustrating a read process for the integrated circuit memory of FIG. 4.

The operation of the read state machine 305 can be understood with reference to FIG. 5 according to one example. According to the technique shown in FIG. 5, the state machine is programmed to execute a process which involves first receiving a read data command (step 400). The read data command is interpreted to determine whether a flash or ROM mode read is demanded (step 401). If a flash mode read is selected, the channel well is set to a first level, such as ground, (step 402) and the data is read (step 403). In the flash mode, the data in the cell is determined predominantly by the charge in the floating gate of the cells. The deep implants do not significantly affect the thresholds. Further, the program and erase algorithms operate to set the thresholds of the cells with and without the deep implants according to standard program/verify/retry algorithms. See for example U.S. Pat. No 5,463,586, entitled ERASE AND PROGRAM VERIFICATION CIRCUIT FOR NON-VOLATILE MEMORY, which is incorporated by reference as if fully set forth herein.

If at step 401, the ROM mode is selected, the read state machine initiates a sector erase operation for the sector to be read, compensating for the charge on the floating gates by erasing the sector before the read process (step 404). Next, the process involves setting the channel well to a ROM mode bias level, such as −2 volts (step 405). The wordline decoder is used to select a wordline and set it to a ROM mode read voltage and the data is read (step 406). The ROM mode read voltage corresponds to the voltage $V_{WLR}$ 60 of FIG. 2.

Figure 6:
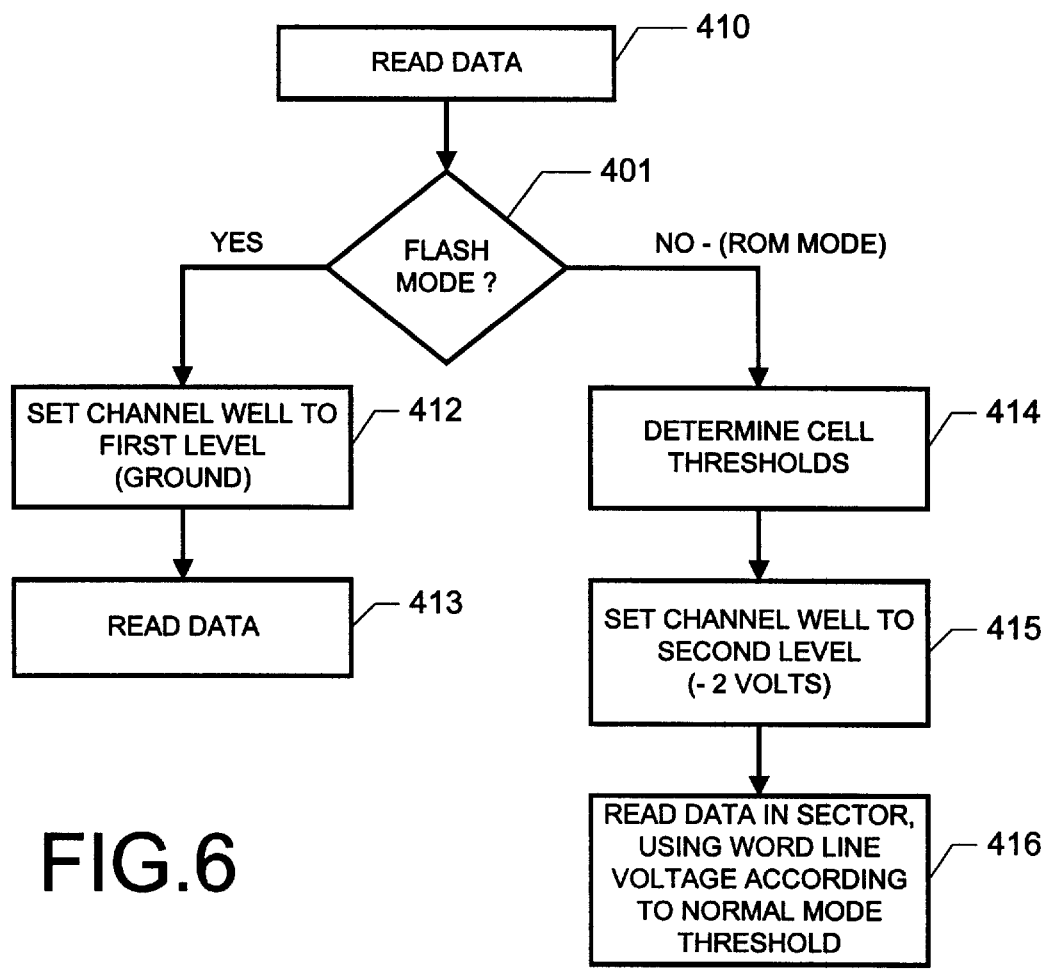
FIG. 6 is a flow chart illustrating another read process for the integrated circuit memory of FIG. 4.

The operation of the read state machine 305 can be understood with reference to FIG. 6 according to another example. According to the technique shown in FIG. 6, the state machine is programmed to execute a process which involves first receiving a read data command (step 410). The read data command is interpreted to determine whether a flash or ROM mode read is demanded (step 411). If a flash mode read is selected, the channel well is set to a first level, such as ground, (step 412) and the data is read (step 413). In the flash mode, the data in the cell is determined predominantly by the charge in the floating gate of the cells. The deep implants do not significantly affect the thresholds. Further, the program and erase algorithms operate to set the thresholds of the cells with and without the deep implants according to standard program/verify/retry algorithms, as mentioned above.

If at step 411, the ROM mode is selected, the read state machine initiates a first read to determine the threshold of the cells being read under the normal substrate bias, in order to compensate for the charge on the floating gates (step 414). Next, the process involves setting the channel well to a ROM mode bias level, such as −2 volts (step 415). The wordline decoder is used to select a wordline and set it to a ROM mode read voltage which has a first level for cells having a high threshold state due to charge in the floating gate, such as at a level above point 53 in FIG. 2, and a second level for cells having a low threshold state due to charge in the floating gate, such as at a level above point 51 in FIG. 2, and the data is read (step 416).

In the alterative approach of FIG. 6, the charge stored on the floating gate is compensated for by first sensing the threshold of the cell without substrate bias, and then with substrate bias, in order to determine whether a ROM code implant has been made in the cell, using for example a binary search method in the sensing circuitry to sense the data. This way, the sector subject of the ROM mode read operation need not be erased to compensate for charge in the floating gates of cells.

Figure 7:
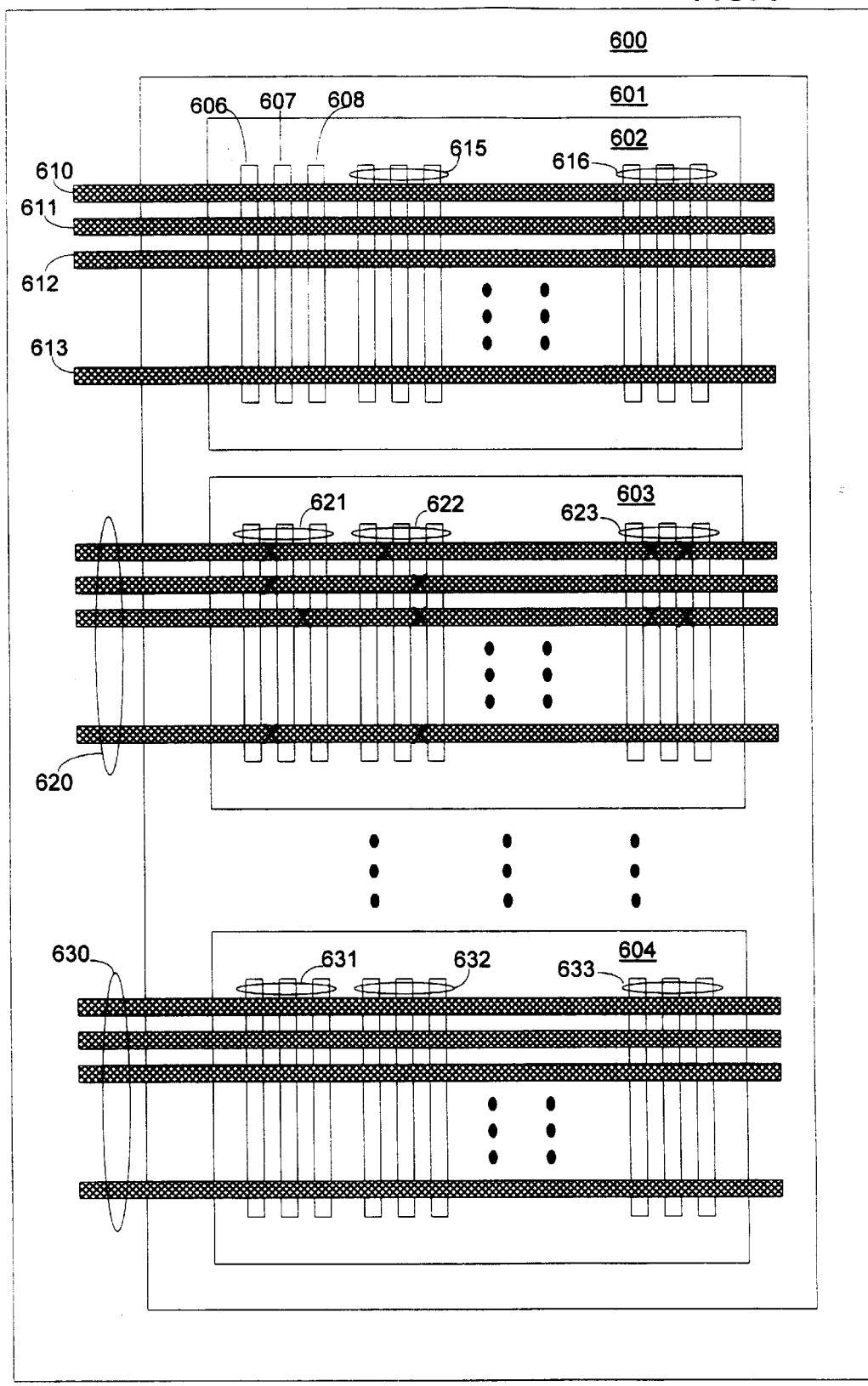
FIG. 7 illustrates a triple well architecture for a dual mode array, with sector by sector channel wells.
Figure 8:
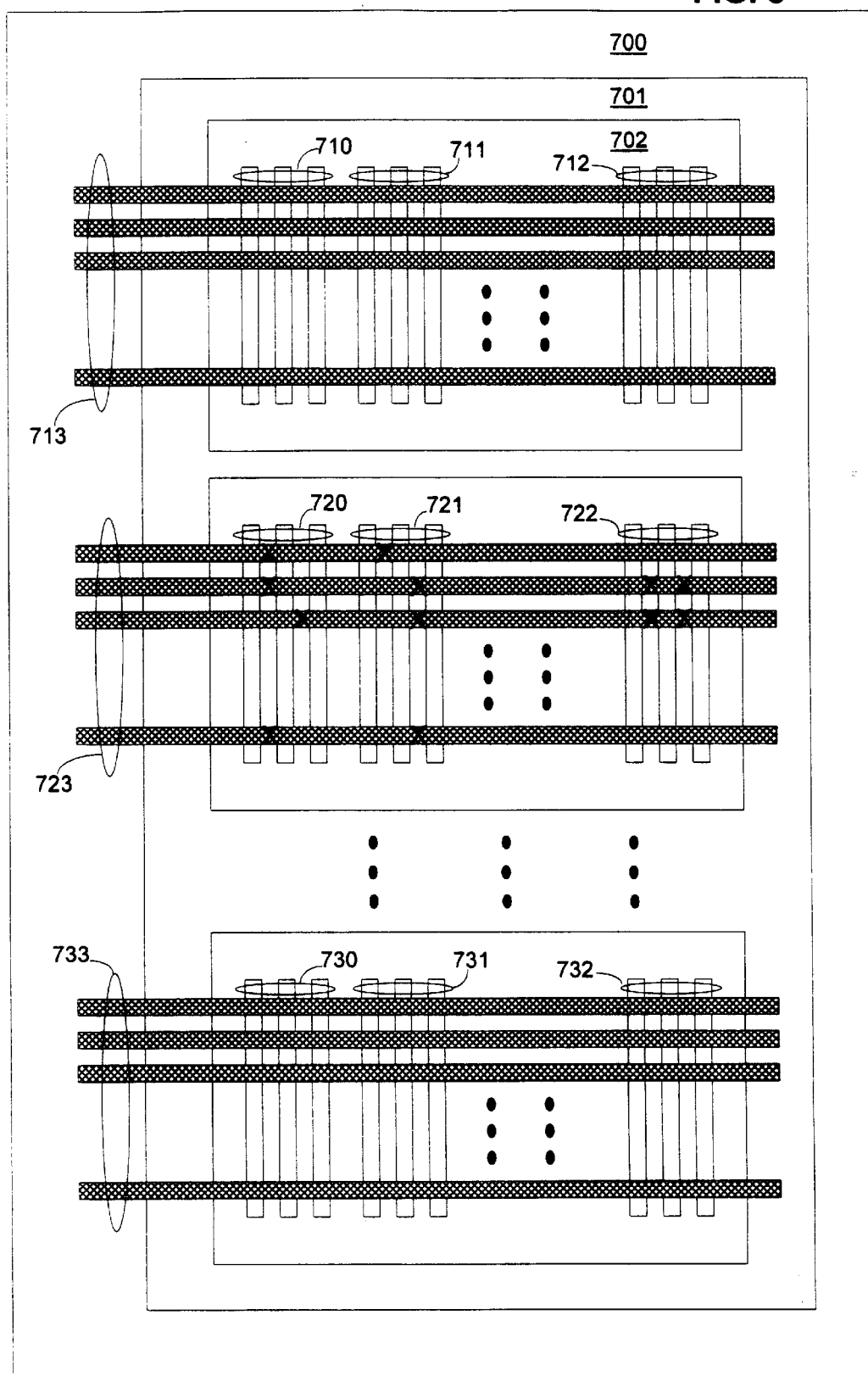
FIG. 8 illustrates a triple well architecture for a dual mode array, with a single channel well.

Two basic architectures are shown in FIG. 7 and FIG. 8 for laying out the isolation well and channel well according to the present invention. FIG. 7 illustrates an embodiment in which there are a plurality of channel wells along with a corresponding plurality of separate arrays of floating gate memory cells. In FIG. 7, the semiconductor substrate is represented by the outer box 600. The isolation well is shaded box 601. The channel wells in the figure include channel well 602, channel well 603 and channel well 604. As represented in the figure, there may be a number of channel wells with corresponding arrays of floating gate memory cells in each one. The arrays of floating gate memory cells in the device of FIG. 7 are illustrated in a simplified format, with the drain and source diffusion regions and word lines shown. The global bit lines, block select circuitry, and other circuits necessary for completing the structure and not illustrated in the figure, are well understood by persons of skill in the art. For instance, this architecture can be implemented as described in U.S. Pat. No. 5,399,891, U.S. Pat. No. 5,414,664, or U.S. Pat. No. 5,526,307, all of which are incorporated by reference as if fully set forth herein.

Although the drain-source-drain structure of FIGS. 7 and 8 are presently preferred, other architectures are suitable, such as a virtual ground architecture with continuous arrays.

In this example, a plurality of drain-source-drain structures are shown in channel well 602, in which a drain diffusion 606, a source diffusion 607 and a drain diffusion 608 define two columns of cells, and in which word lines 610, 611, 612, 613 intersect the drain diffusion 606, source diffusion 607, and drain diffusion 608 over memory cells. Within the channel well 602, additional drain-source-drain structures 615, 616 are included to provide an array within the channel well 602. As illustrated in the figure by the shading, the isolation well 601, the drain diffusion regions 606 and 608, and the source diffusion regions 607, all have the same conductivity type, preferably n-type. The substrate 600 and the channel region 602 are both of the same conductivity type, preferably p-type.

The arrays in other channel wells 603 and 604 are configured with a similar structure. Thus, a plurality of word lines 620 is included for channel well 603. Drain-source-drain structures 621, 622, 623 within channel well 603 intersected by the word lines 620 form the array of flash memory cells.

In a similar fashion the channel well 604 includes an array of flash memory cells composed of the word lines 630, and the drain-source-drain structures 631, 632 and 633.

This architecture is suitable for systems in which it is desirable to erase arrays having a block size equal to that of the channel well, such as the channel well 603. The channel wells can be individually biased to avoid disturbance of unselected cells, and to reduce stress on peripheral devices outside of the array on the substrate.

In FIG. 7, the deep implants established by the masking operation of FIGS. 3A–3B, for ROM mode reading, are represented by the "X" symbols in the channels of the cells of channel well 603 for example.

For a smaller array size, and a smaller overall integrated circuit size, the architecture of FIG. 8 is suitable. According to the architecture FIG. 8, substrate 700 has a first conductivity type, such as p-type. An isolation well 701 has a second conductivity type, preferably n-type. A channel well 702 is formed within the isolation well 701, having a conductivity type which is the same as that of the substrate. A plurality of blocks of floating gate memory cells is formed within the channel well 702 to produce a large array. Thus, a first block includes a set of drain-source-drain structures 710, 711, 712 and a set of word lines 713. The individual flash memory cells reside between the source and drain diffusions and underneath the word lines in the array. A second block of cells is based on drain-source-drain structures 720, 721 and 722 with word lines 723. A third set of cells is based on drain-source-drain structures 730, 731 and 732, with word lines 733.

In FIG. 8, as in FIG. 7, the deep implants established by the masking operation of FIGS. 3A–3B, for ROM mode reading, are represented by the "X" symbols in the channels of the cells in one sector for example.

Accordingly, a low cost and simple to manufacture dual mode flash memory/ROM device has been provided taking advantage of the non-linearity of the body effect with doping concentration, particularly in the presence of deep implants.

The foregoing description of a preferred embodiment of the invention has been presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. An integrated circuit memory, comprising:
    an array of memory cells storing data according to a first storage mode, the memory cells comprising transistors having channels in channel regions of a semiconductor substrate, and having threshold voltages dependent on a dope concentration in the channel regions, the array including a first set of memory cells with a base dope concentration in the channel regions, and a second set of memory cells in the array with code implants which change dope concentrations in the channel regions;
    a plurality of word lines and bit lines coupled respectively with rows and columns of memory cells in the array by which to read data stored in the array; and
    resources to apply a first bias potential to channel regions of transistors in the memory cells in the array during a first read mode at which the memory cells have particular threshold voltages and to sense data stored according to the first storage mode, and to apply a second bias potential to channel regions of memory cells in the array during a second read mode to induce a shift in the threshold voltages in the memory cells, the shift being different in the second set of memory cells than in the first set of memory cells, due to the code implants, and to sense data stored by the code implants.

2. The integrated circuit memory of claim 1, wherein the transistors in the memory cells comprise floating gate transistors, and the threshold voltages of the memory cells are determined predominantly by charge in the floating gates during the first read mode, and in a second mode during which the second bias potential is applied to the channel regions, in which charge in floating gates of cells to be read in the array is compensated for, and the threshold voltages of the memory cells are determined predominantly by presence or absence of the code implants.

3. The integrated circuit memory of claim 1, wherein the memory cells comprise n-channel floating gate transistors, and wherein the second bias potential is negative, and the first bias potential is ground.

4. The integrated circuit memory of claim 1, wherein second bias potential has an absolute value greater than the first bias potential.

5. The integrated circuit memory of claim 1, wherein the transistors in the array of memory cells include base implants to establish the base dope concentration.

6. The integrated circuit memory of claim 1, wherein the code implants comprise p-type dopants.

7. The integrated circuit memory of claim 1, wherein the code implants comprise boron and have a depth in the channel regions of the second set of memory cells according to implantation with an ion implantation process at an energy in a range of 175 to 500 keV.

8. The integrated circuit memory of claim 1, wherein the code implants comprise boron and have a depth in the channel regions of the second set of memory cells according to implantation with an ion implantation process at an energy in a range of 200 to 250 keV.

9. The integrated circuit memory of claim 1, wherein the array of memory cells includes a base implant to establish the base dope concentration.

10. The integrated circuit memory of claim 1, wherein the array of memory cells includes a plurality of sectors, and the resources to apply the second bias potential are coupled to the plurality of sectors, and enabled on a sector by sector basis.

11. The integrated circuit memory of claim 10, wherein the second set of memory cells consist of cells in a single sector in the plurality of sectors.

12. An integrated circuit memory, comprising:

an array of floating gate memory cells, the memory cells comprising floating gate transistors having channels in channel regions of a semiconductor substrate, and having threshold voltages dependent on a dope concentration in the channel regions and on charge in the floating gates, the array including a first set of memory cells with a base dope concentration in the channel regions, and a second set of memory cells in the array with code implants which change dope concentrations in the channel regions;

a plurality of word lines and bit lines coupled respectively with rows and columns of memory cells in the array by which to read data stored in the array, and by which to charge and discharge the floating gates of memory cells in the array; and resources to apply a first bias potential to channel regions of memory cells in the array at which the memory cells have particular threshold voltages, and to apply a second bias potential to channel regions of memory cells to induce a shift in the threshold voltages in the memory cells, the shift being different in the second set of memory cells than in the first set of memory cells, due to the code implants.

13. The integrated circuit memory of claim 12, including:

resources to read memory cells in the array in a first mode during which the first bias potential is applied to the channel regions, and the threshold voltages of the memory cells are determined predominantly by charge in the floating gates, and in a second mode during which the second bias potential is applied to the channel regions, in which charge in floating gates of cells to be read in the array is compensated for, and the threshold voltages of the memory cells are determined predominantly by presence or absence of the code implants.

14. The integrated circuit memory of claim 12, wherein the memory cells comprise n-channel floating gate transistors, and wherein the second bias potential is negative, and the first bias potential is ground.

15. The integrated circuit memory of claim 12, wherein second bias potential has an absolute value greater than the first bias potential.

16. The integrated circuit memory of claim 12, wherein the array of memory cells includes a base implant to establish the base dope concentration.

17. The integrated circuit memory of claim 12, wherein the code implants comprise p-type dopants.

18. The integrated circuit memory of claim 12, wherein the code implants comprise boron and have a depth in the channel regions of the second set of memory cells according to implantation with an ion implantation process at an energy in a range of 175 to 500 keV.

19. The integrated circuit memory of claim 12, wherein the code implants comprise boron and have a depth in the channel regions of the second set of memory cells according to implantation with an ion implantation process at an energy in a range of 200 to 250 keV.

20. The integrated circuit memory of claim 12, wherein the array of floating gate memory cells includes a base implant to establish the base dope concentration.

21. The integrated circuit memory of claim 12, wherein the array of floating gate memory cells includes a plurality of sectors, and the resources to apply the second bias potential are coupled to the plurality of sectors, and enabled on a sector by sector basis.

22. The integrated circuit memory of claim 21, wherein the second set of memory cells consist of cells in a single sector in the plurality of sectors.

* * * * *